United States Patent [19]

Hagiwara

[11] 4,133,099

[45] Jan. 9, 1979

[54] METHOD OF MANUFACTURING A CHARGE TRANSFER DEVICE

[75] Inventor: Yoshiaki Hagiwara, Yokohama, Japan

[73] Assignee: Sony Corporation, Tokyo, Japan

[21] Appl. No.: 821,183

[22] Filed: Aug. 2, 1977

[30] Foreign Application Priority Data

Aug. 20, 1976 [JP] Japan ................................. 51-99961

[51] Int. Cl.$^2$ ............................................. B01J 17/00
[52] U.S. Cl. ........................................ 29/578; 29/590; 357/24
[58] Field of Search ................. 29/571, 578, 579, 590; 357/24, 59, 91

[56] References Cited

U.S. PATENT DOCUMENTS

| | | | |
|---|---|---|---|
| 3,936,860 | 3/1976 | Hill | 357/59 |
| 3,967,365 | 7/1976 | Friedrich | 29/579 |
| 3,996,658 | 12/1976 | Takei | 29/571 |
| 4,057,895 | 11/1977 | Ghezzo | 357/59 |

Primary Examiner—W. Tupman
Attorney, Agent, or Firm—Hill, Gross, Simpson, Van Santen, Steadman, Chiara & Simpson

[57] ABSTRACT

A method of manufacturing charge transfer devices in which an asymmetrical potential well in the direction of charge transfer is formed by the shape of narrower portions of a transfer channel which is bordered by highly doped channel stoppers. Impurities are diffused through a first mask into a polycrystalline silicon layer on the surface of a semiconductor substrate to construct transfer electrodes of highly doped polycrystalline layer. Then impurities are diffused into a semiconductor substrate through openings bordering on one edge with a first mask to form the highly doped portions to make the narrower portions of the transfer channel to assure that the edges of the transfer electrode and the edge of the narrower portion are aligned.

10 Claims, 27 Drawing Figures

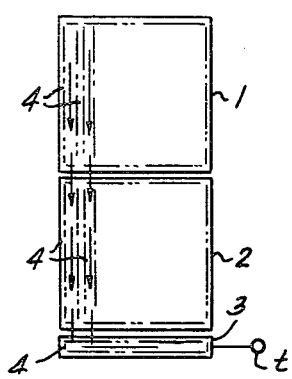
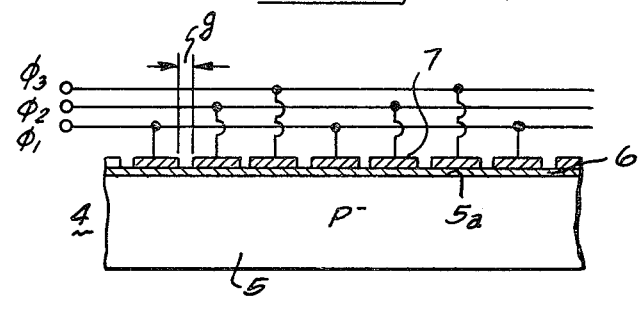
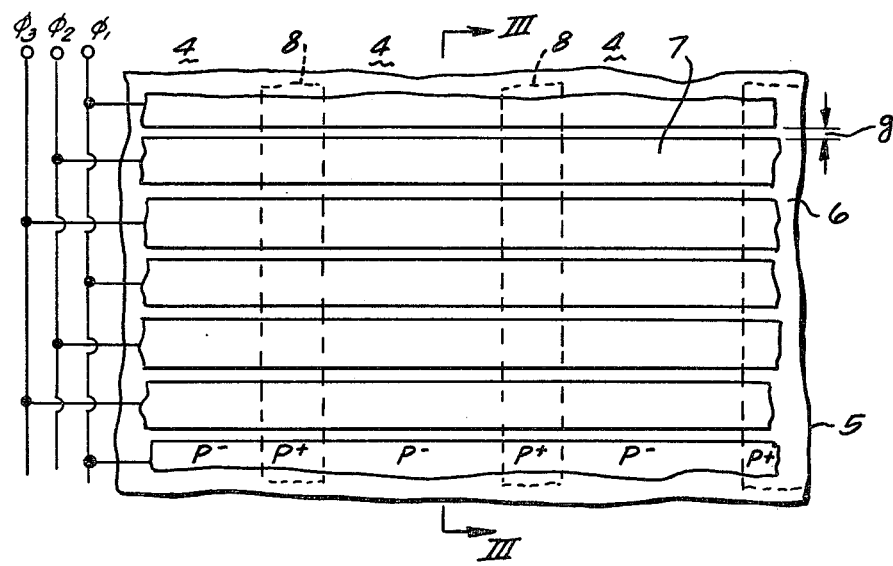
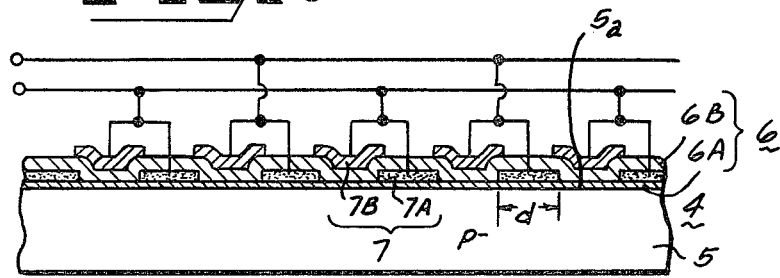

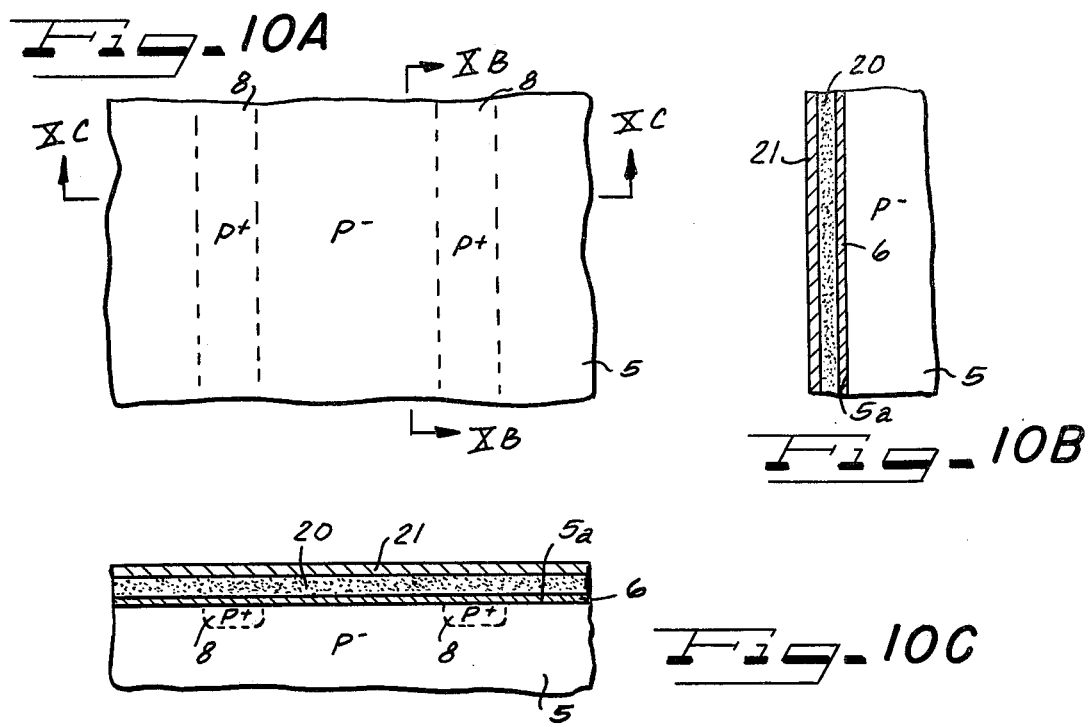
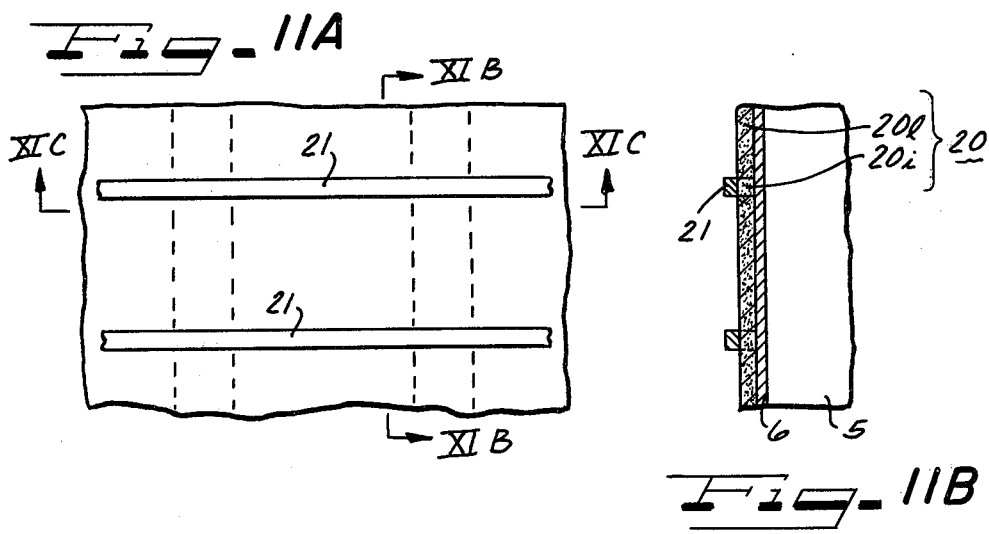
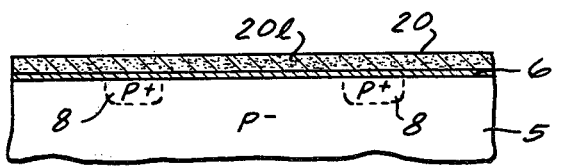

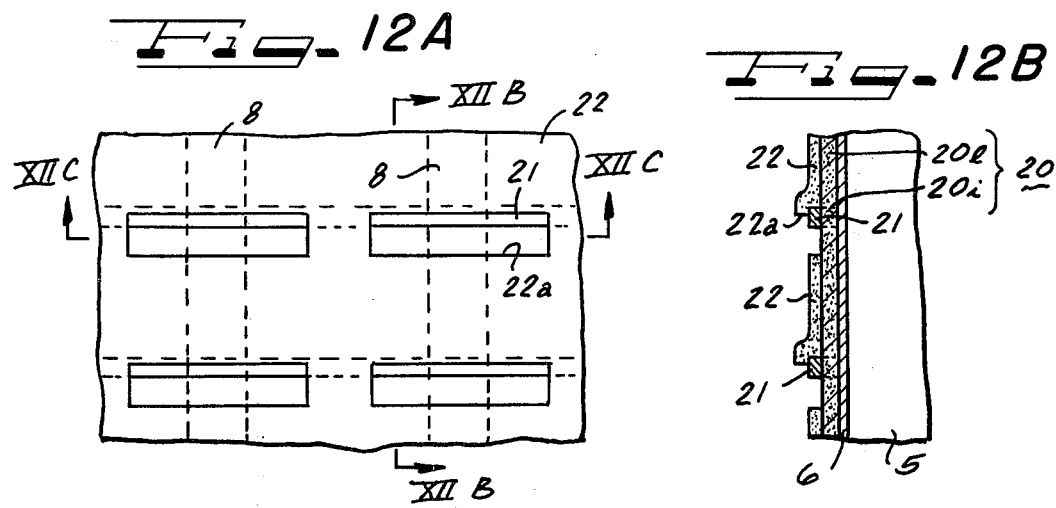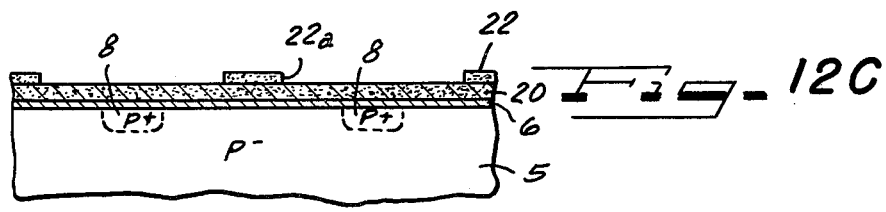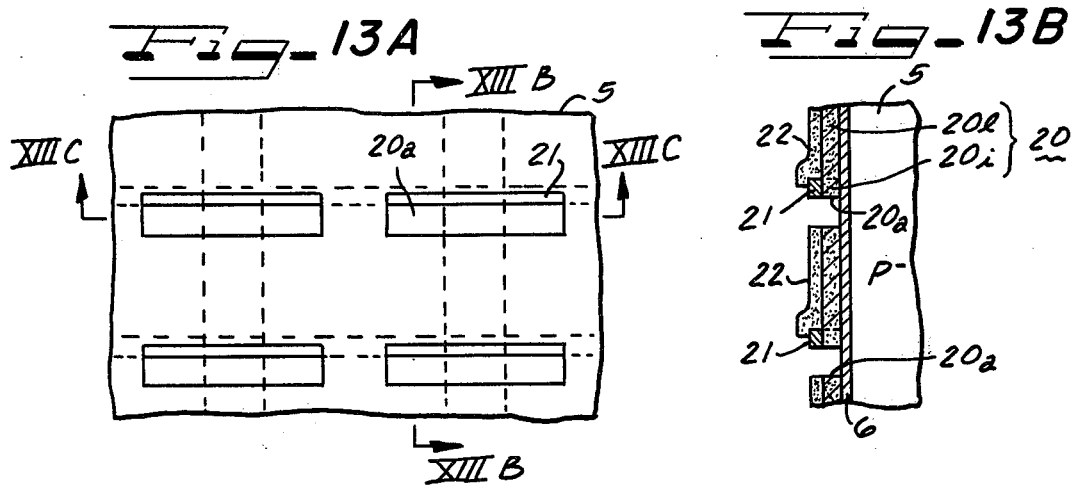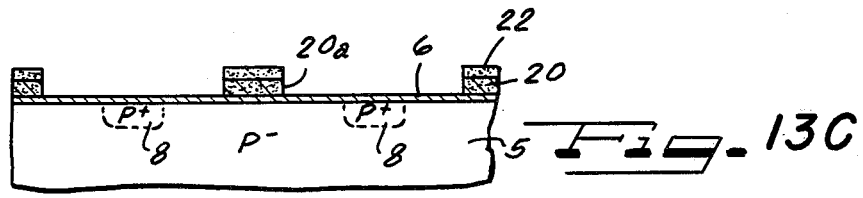

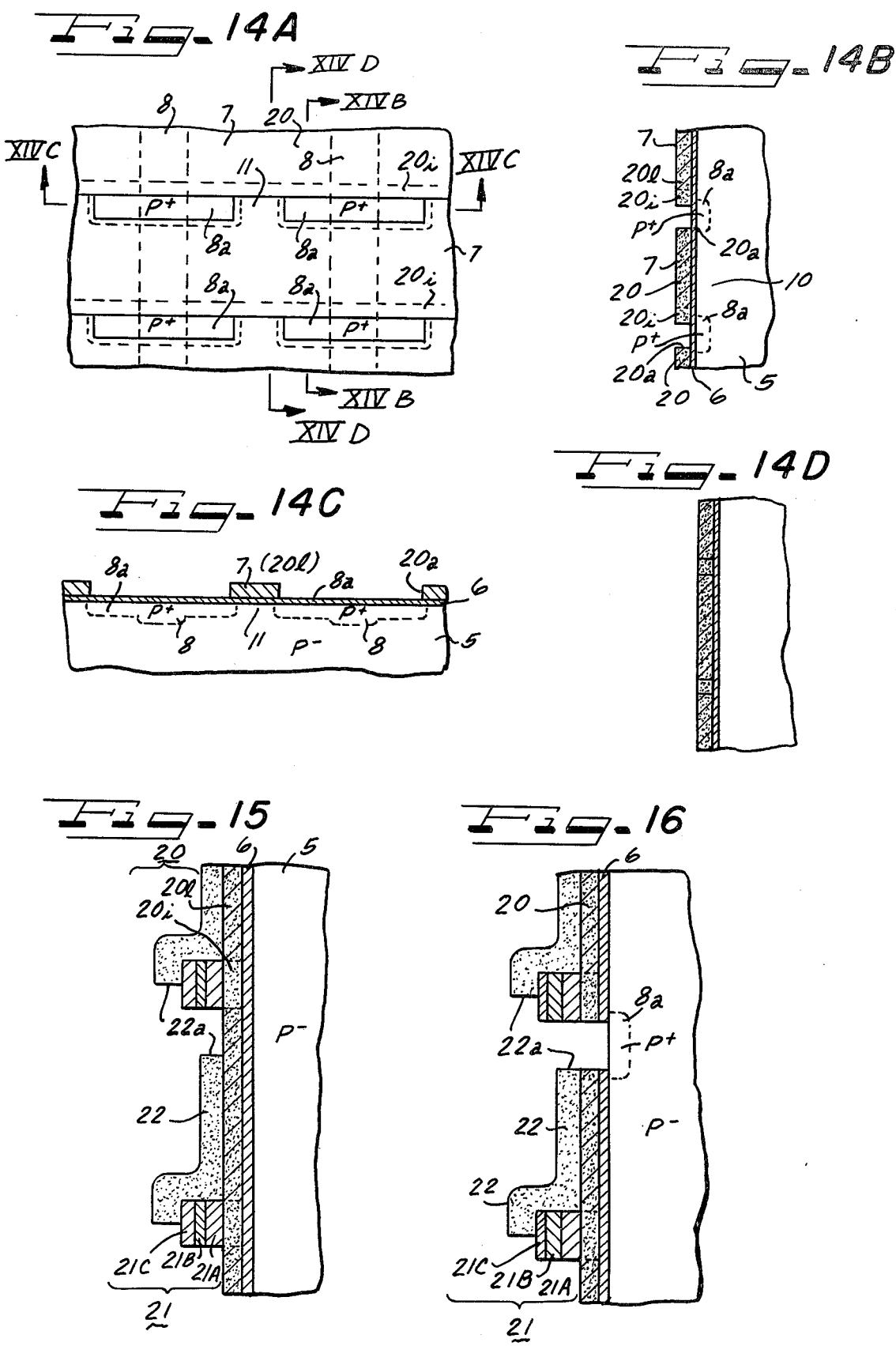

METHOD OF MANUFACTURING A CHARGE TRANSFER DEVICE

BACKGROUND OF THE INVENTION

1. Field of the Invention

The present invention relates in general to a method of manufacturing a charge transfer device and particularly to a method of manufacturing a charge transfer device in which an asymmetrical potential well is formed by constructing narrower portions in the direction of charge transfer in the transfer channel which is bordered by highly doped channel stoppers.

2. Description of the Prior Art

Charge transfer devices have been well known for storing and transferring charges in a storage medium by the use of appropriate potentials which are applied upon an insulating layer overlying one surface of the device. The charge coupled devices are applicable in many applications for example as delay lines, memory devices and image sensors. The article entitled "Charge Coupled Imaging-State of the Art" which appeared in the magazine "Solid State Devices" dated 1973 at pages 83 through 107, discloses a number of charge coupled devices as well as charge coupled image sensors.

One type of charge coupled image sensor device is known as a so-called frame transfer system.

As shown in FIG. 1, a charge coupled image sensor device comprises a sensor portion 1, a temporary storage portion 2 and a read-out horizontal shift register 3. The sensor portion 1 generates charges corresponding to the intensity of incident light images on each of the sensor cells and the charges are transferred to the storage portion 2 from the image sensor 1 in the vertical direction relative to FIG. 1.

The storage portion 2 stores the charges temporarily and transfers them in the vertical direction. The horizontal shift register 3 transfers the charges which are transferred from the last stage of the storage section 2 in the horizontal direction to the output circuit. Thus, the charges corresponding to the images can be read out from the output terminal t.

The sensor portion 1 comprises a plurality of vertical charge transfer devices 4 arranged parallel to each other and the storage portion 2 also comprises a plurality of vertical charge transfer devices 4 corresponding to those of the sensor portion and the shift register 3 also comprises a charge transfer device 4.

FIGS. 2 and 3 illustrate an example of the sensor portion 1 of the charge transfer imaging device. As shown from a top plan view in FIG. 2, there are provided a plurality of charge transfer devices 4 arranged parallel in column to make vertical lines. The device comprises a substrate 5 formed of, for example, silicon upon which a dielectric layer 6 of silicon dioxide or some other similar substance is deposited and a plurality of electrodes 7 are formed on the silicon dioxide layer 6 and are arranged in charge transfer direction to form a transfer device. As shown in FIG. 2, the electrodes 7 are provided commonly to the common horizontal lines of each charge transfer device 4. That is to say each electrode 7 extends in the direction transverse to the direction of charge transfer direction. Every third gate electrode 7 is electrically connected together so that there are three sets of electrodes to which can be applied three phase clock voltages $\phi_1$, $\phi_2$ and $\phi_3$ as shown. There are also provided channel stoppers 8 adjacent to the major surface 5a which have higher impurity concentration than that of the substrate between each of the charge transfer devices so as to prevent mutual flow of signal charges between each of the charge transfer devices. Incident light is received onto the substrate and passes into the substrate through gaps g formed between each of the electrodes and charges are generated corresponding to the intensity of the incident light.

In such three phase charge transfer devices, three phase clock voltages $\phi_1$, $\phi_2$ and $\phi_3$ form potential wells having different depths in the substrate adjacent gate electrodes so that electrical charges generated by the incident light can be transferred unilaterally through the devices. Three phase charge transfer devices have a number of disadvantages which are well known.

FIGS. 4 and 5 illustrate another example of the sensor portion of charge coupled devices of the prior art utilizing two phase clock drive in which the elements similar to those in FIGS. 2 and 3 are indicated by the same reference numerals. In this case, there is provided a substrate 5 of silicon upon which a first dielectric layer 6A of silicon dioxide is deposited and a plurality of first electrodes 7A are formed in predetermined parallel arrangement. The first electrodes are formed of polycrystalline silicon doped with an impurity. A second insulating layer 6B is formed completely over the surface including the first insulating layer 6A upon which a plurality of second electrodes 7B are formed of metal deposited between the first polycrystalline silicon electrodes 7A. The neighboring pairs of electrodes 7A and 7B are commonly connected and serve as gate electrodes 7. Every other pair of electrodes receive two phase clock voltages $\phi_1$ and $\phi_2$. The first electrodes are transparent so that light passes through them into the substrate. The first electrodes 7A is arranged over the first insulating layer 6A while the second electrode 7B is arranged over the first insulating layer 6A and the second insulating layer 6B. Thus, the thickness of the insulating layers are different under the first electrode 7A and under the second electrode 7B to thus form an asymmetrical potential well in the direction of charge transfer under the application of clock voltages. Thus, charges generated by the incident light can be transferred unilaterally through the device. However, two phase charge coupled devices in which the thickness of the insulating layer is constructed different under the electrodes 7A and 7B are very difficult to fabricate. Also, it is very troublesome to construct two separate sets of electrodes 7A and 7B.

Also, other prior art devices such as shown in Amelio U.S. Pat. No. 3,995,302 wherein the impurity concentration of the substrate surface under each electrode is caused to vary between the front and rear edges are known, however, such devices are also very difficult to manufacture. Furthermore, the miniaturization of such devices is very difficult due to the varying thickness of the insulating layers and also due to the variation in the doping impurity concentrations.

So as to overcome the above mentioned disadvantages, Y. Hagiwara and H. Yamazaki proposed a new charge transfer device shown in copending U.S. patent application Ser. Nos. 703,792 filed July 9, 1976 assigned to the assignee of the present application in which the charge transfer channel has narrower portions bordered by highly doped channel stoppers so as to cause an asymmetrical potential well in the direction of charge transfer.

FIGS. 6 to 9 illustrate a sensor portion of charge transfer devices constructed according to teaching of copending patent application Ser. No. 703,792. In this structure, there are also provided channel stoppers 8 having higher impurity concentration adjacent a major surface 5a of the semiconductor substrate 5 so as to isolate each vertical line of the charge transfer device. The portions between the channel stoppers are transfer channels of each of the charge transfer devices. An insulating layer 6 is deposited on the major surface 5a of the substrate on which a plurality of electrodes 7 are formed transverse to the direction of vertical lines and formed commonly over the vertical lines with a predetermined gap g therebetween. Projecting portions 8a which have higher impurity concentration then the portions of the transfer channels project into each of the vertical lines and are formed at the same time as the channel stoppers 8 are diffused. The projection portions are formed at the rear edges of the portions of the transfer channel under each of the electrodes 7 relative to the direction of charge transfer direction illustrated by the arrow A in FIG. 6. The projection portions form narrower portions in the transfer channel which effect the depth of potential wells formed therein so as to make an asymmetrical potential well in the direction of charge transfer. Then in a manner similar to the known two phase charge coupled devices, every other electrode receives two phase clock voltages $\phi_1$ and $\phi_2$. In these constructions, the surface potential of storage regions under the electrodes 10 are different between the narrower portion and under the rest of the portions of the electrode. The result is that the potential well is asymmetrical in the direction of charge transfer. FIG. 9 illustrates a diagram of surface potential wherein $\phi_1$ is off and $\phi_2$ is on. As shown by the dotted line in FIG. 9, there are formed potential barriers corresponding to the narrower portions 11 which are higher than the remaining portions of the storage region by an amount $\Delta a$ and $\Delta b$. Then there is provided a step-like potential from the region under the electrode which is not receiving any voltage to the region under the electrode which has applied thereto the voltage $\phi$ to cause the charge flow in the direction shown by the arrow B.

Thus, the charge transfer device which is provided has narrower portions formed by the channel stoppers in the transfer channel can be operated by two phase clock voltages without changing the thickness of the insulating layer or the surface impurity concentration and asymmetrical potential wells are formed without these expedients. In this structure, it is very desirable to provide the correct registration between the narrower portions 11 of the transfer channel and electrodes 7, in other words, the relationship between the rear edges of the projection portions 8a and the rear edges of the electrode 7 and the front edge of the preceding electrode.

SUMMARY OF THE INVENTION

It is an object of the present invention to provide a method of manufacturing a charge transfer device.

It is another object of the invention to provide a method of manufacturing a charge transfer device in which asymmetrical potential wells are formed by the effect of narrower portions in the transfer channel bordered by highly doped regions of semiconductor substrates.

It is a further object of the present invention to provide a method of manufacturing a charge transfer device in which the relationship between the narrower portions and the electrodes are accurately aligned.

Other objects, features and advantages of the invention will be readily apparent from the following description of certain preferred embodiments thereof taken in conjunction with the accompanying drawings although variations and modifications may be effected without departing from the spirit and scope of the novel concepts of the disclosure and in which:

BRIEF DESCRIPTION OF THE DRAWINGS

FIG. 1 illustrates a charge coupled imaging device using a so-called frame-transfer system, FIG. 2 is an enlarged plan view of three phase charge transfer device of the prior art, FIG. 3 is a cross-sectional view taken on line III—III of FIG. 2, FIG. 5 is a cross-sectional view taken on line V—V of FIG. 4, FIGS. 10A, 11A, 12A, 13A and 14A are an enlarged plan view of each step; FIGS. 10B, 11B, 12B, 13B and 14B are cross-sectional views taken on lines B—B from FIGS. 10A–14A; FIGS. 10C, 11C, 12C, 13C and 14C are cross-sectional views taken on lines C—C in FIGS. 10A–14A, FIG. 14D is a cross-sectional view taken on line D—D in FIG. 14A, and FIGS. 15 and 16 shows steps of another process of manufacturing of this invention.

DESCRIPTION OF THE PREFERRED EMBODIMENTS

According to the aspect of the present invention, there is provided a method of manufacturing a charge transfer device comprising the steps of depositing a polycrystalline silicon layer on the surface of an insulating layer formed on a major surface of a semiconductor substrate and then forming a first masking layer for selective diffusion of doping impurities and selectively removing the polycrystalline silicon layer and forming a second masking layer for selectively etching of the polycrystalline silicon layer. Then selectively diffusing a doping impurity through the first masking layer and selectively removing the polycrystalline layer through the first and second masking layers to make openings lying over a portion of the first masking layer and selectively diffusing a doping impurity through the opening into the substrate to form a narrower portion of transfer channel wherein the relationship of the narrower portion and the electrodes are very accurately and precisely aligned.

Figure 4:
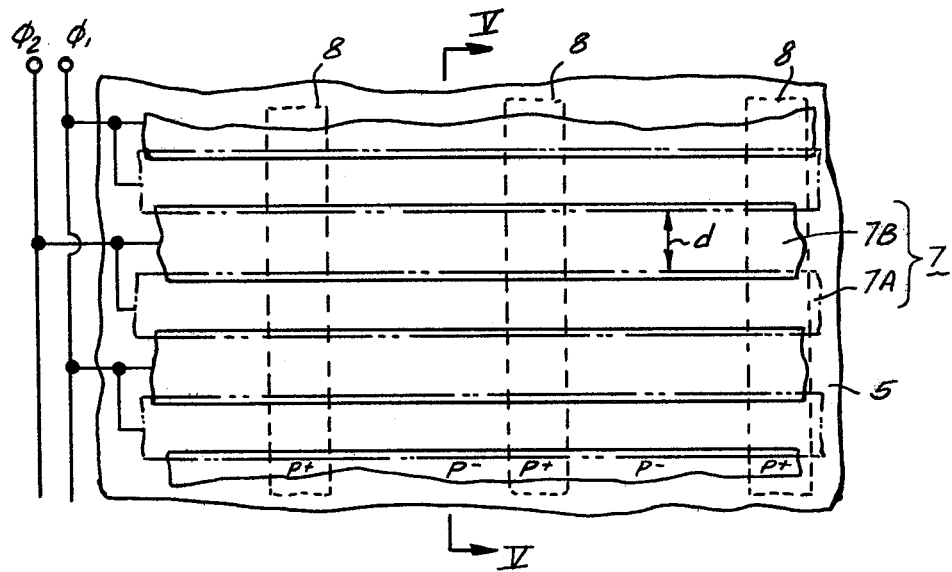
FIG. 4 is an enlarged plan view of two phase charge transfer devices of the prior art.
Figure 6:
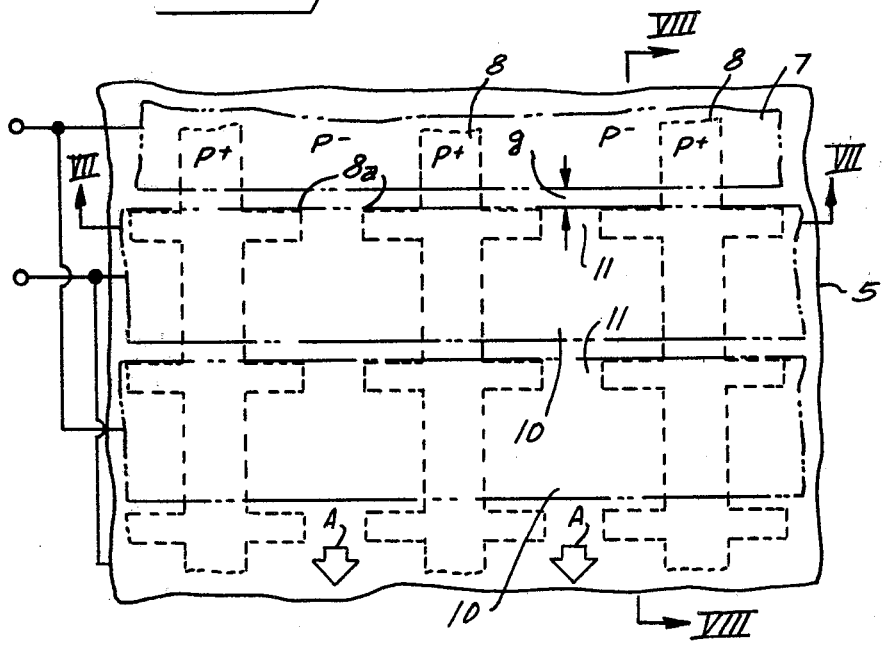
FIG. 6 is an enlarged plan view of two phase charge transfer devices shown in copending U.S. patent application Ser. No. 703,792.
Figure 7:
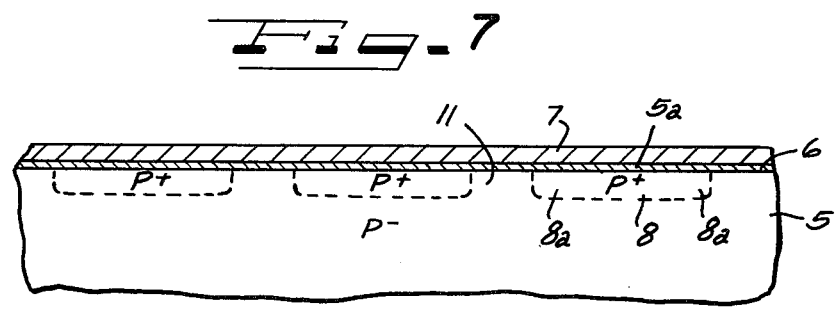
FIG. 7 is a cross-sectional view taken on line VII—VII of FIG. 6.
Figure 8:
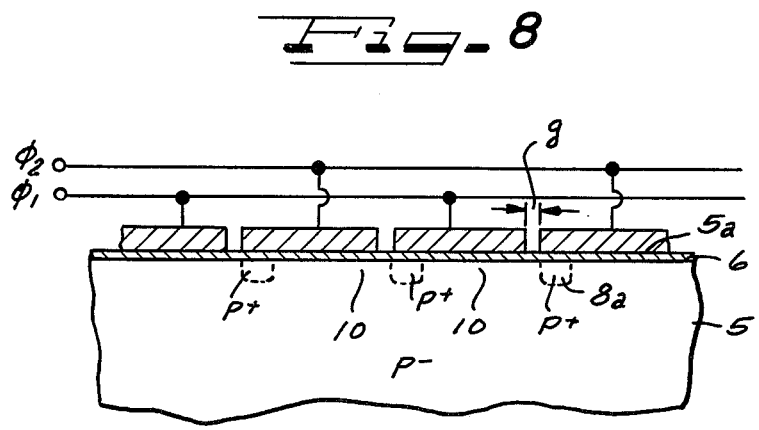
FIG. 8 is a cross-sectional view taken on VIII—VIII of FIG. 6.
Figure 9:
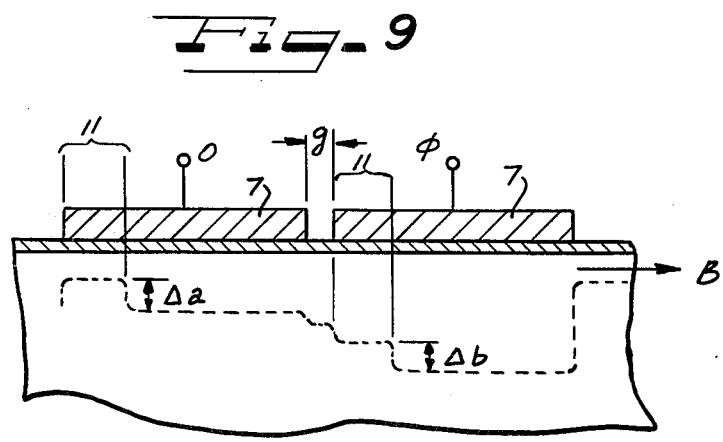
FIG. 9 illustrates a potential diagram along a charge transfer channel in the device shown in FIGS. 6 to FIG. 8, FIGS. 10A–C through 14A–D illustrate steps of a process of manufacturing a charge transfer device of this invention.

Refer to FIGS. 10 through 14 in which a process according to the invention for manufacturing a charge transfer device is disclosed. In this example, the process of manufacturing an image portion of solid state imaging device such as shown in FIGS. 6 through 9 is illustrated. As initially shown in FIGS. 10A, 10B and 10C a semiconductor substrate 5 of a first conductivity type for example, P-type semiconductor substrate is provided. Channel stopper regions 8 having the same conductivity type as the substrate and having a higher impurity concentration then the substrate which isolate each of the vertical lines are provided adjacent to a major surface 5a of the substrate by selective diffusion of impurities and at the same time the source and drain regions of the output field effect transistor are formed. The source and drain regions are not illustrated in the Figures but are well known to those skilled in the art. Then an insulating layer 6, for example, of silicon dioxide $SiO_2$ having a thickness of 3000 Å is formed all over the surface of the substrate by thermal oxidation of silicon.

Next, a polycrystalline semiconductor layer such as a polycrystalline silicon layer 20 having a thickness, for example, of about 5000 Å is formed over the insulation layer 6. Then a first masking layer 21 is formed on the polycrystalline silicon layer 20. The first masking layer 21 serves as an etching mask for the polycrystalline silicon layer 20 and a selective diffusion mask. The first masking layer may be composed of, for example, silicon dioxide $SiO_2$ layer deposited by a chemical vapor deposition (CVD) technique.

The next step is illustrated in FIGS. 11A, B and C in which the first masking layer 21 is partially removed by using a photo etching technique to leave a predetermined pattern on the polycrystalline layer 20. The remaining portions of the first masking layer 21 correspond to the gap between the electrodes 7 illustrated in FIGS. 6 through 9 wherein no transfer electrodes are formed.

A doping impurity having the same conductivity type as that of the channel stopper regions 8 and which can, for example, be boron is diffused into the polycrystalline silicon layer 20 through the first masking layer 21. By the diffusion of boron, highly resistive polycrystalline silicon regions 21i are formed under the first masking layer 21 and low resistivity (highly conductive) polycrystalline silicon regions 21l are formed where the first masking layer 21 does not cover the layer.

Next as shown in FIGS. 12A, 12B and 12C the second masking layer is selectively formed on the surface. The second masking layer is used as a selective etching mask for the polycrystalline silicon layer. The second masking layer is formed of photoresist material (photosensitive resin). The layer of photoresistive material is first formed all over the surface and then selectively exposed and developed to form openings 22a thus, the second masking layer 22 is formed by making openings 22a. The pattern of the second masking layer 22 has openings at the portions corresponding to the areas where the projection portions 8a of the channel stoppers 8 are to be formed as explained relative to FIGS. 6 through 9. In this case, one edge of the opening may be formed on the first masking layer. As shown in FIGS. 13A, 13B and 13C, the polycrystalline silicon layer 20 is selectively etched through the first and second masking layers. In other words, openings 20a are formed through the polycrystalline layer where it is not covered by the first and second masking layers.

Next, as shown in FIGS. 14A, 14B and 14C, after removing the second masking layer 22 if necessary doping impurity of the same conductivity type as the substrate is highly diffused through the openings 20a to form projection portions 8a of the channel stopper 8.

The diffusion may be done by ion implantation technique or thermal diffusion and either process works well. In the case diffusion is carried out by ion implantation technique, it is possible to diffuse impurities into the substrate to form the projection portions 8a of the channel stopper 8 through the openings 20a even though there remains portions of the insulating layer of silicon dioxide in the opening and this can be accomplished by providing a proper energy to the impurity ion which is implanted. While, of course, the insulating layer 6 in the openings 20a may be removed before the diffusion process. Thus, as shown in the Figures and described above, a charge coupled device according to the object of the invention, similar to that illustrated in FIGS. 6 through 9 having narrower portions 11 in the transfer channel 10 under an electrode 7 which is formed by the projection portions 8a of channel stopper 8 and where the gate electrodes 7 are formed by portions 20l of polycrystalline silicon layer 20 and where the impurity is highly doped to make the portion highly conductive is manufactured. The projection portion 8a provides an asymmetrical potential well in the direction of charge transfer direction.

Then electrodes for connecting every other one of the electrodes 7 and bonding pads for connecting electrical leads and other connections are formed to complete the desired charge transfer device.

According to the method of the present invention, the masking layer 20 determines the edge of the electrode formed of polycrystalline silicon and the same masking layer 20 also determines the edge of the projection portion 8a of the channel stopper 8. This assures that registration exists between the electrode 7 and the narrow portion 11a consistently and without variations. This assures that the charge transfer device having a uniform characteristic will be obtained in all instances. Also, the device manufactured according to the present invention provides that there are insulating layers of highly resistive polycrystalline silicon layers such as 20i between each of the electrodes 7 so the insulation between each electrode 7 is very reliable and undesirable shorts do not occur. It is to be realized, of course, that polycrystalline silicon of low impurity concentration exhibits much greater resistivity than the resistivity of single crystal silicon.

The diffusion process for doping impurities into the polycrystalline silicon layer 7 to form the gate electrode 20l is not limited solely to the steps shown in FIG. 11. It may also be carried out after or before the process shown in FIG. 13 and further it may be carried out at the same time when impurity is diffused into the substrate to form the projection portions 8a of the channel stopper by using the masking layer 20.

In the example explained above, the first masking layer 21 is a single layer of silicon dioxide, but if necessary multilayers structures may be employed. For this purpose, the same process as shown in FIGS. 10 through 14 can be carried out. FIGS. 15 and 16 correspond to FIGS. 12B and 13B respectively. These Figures illustrate the first masking layer 21 which is formed of three layers comprising a layer 21A of silicon dioxide $SiO_2$ formed by CVD technique having a thickness of 6000 Å adjacent the polycrystalline silicon layer. Then a layer of $Si_3N_4$ layer 21B having a thickness of 2000 Å and a layer of $SiO_2$ layer 21C formed by CVD technique having a thickness of 5000 Å which serves as a selective etching mask for the underlying $Si_3N_4$ layer. In the above example, narrower portions 11 of the transfer channel are formed by the projection portions 8a which extend from both sides of the channel stoppers 8 but a single projection from one of the channel stoppers can also provide narrower portions to result in asymmetrical potential wells in the direction of charge transfers. Also, islands isolated from both sides of the channel stoppers in the transfer channel which have high impurity concentration of the same type of conductivity as the channel stoppers 8 can provide an asymmetrical potential well in the direction of charge transfer.

It is apparent that the method of this invention is applicable not only to the manufacture of imaging portions of frame-transfer type charge transfer devices, but also for manufacturing charge transfer devices in general.

Further, the method of the present invention is applicable to make not only surface channel charge transfer devices but also buried channel charge transfer devices.

Many modifications can be made which are well within the intent and scope of the present invention as defined by the appended claims.

I claim as my invention:

1. A method of manufacturing a charge transfer device having a plurality of electrodes formed on an insulating layer and a transfer channel formed of a portion of semiconductor substrate transferring signal charges in one direction, said transfer channel having narrowed portions bordered by channel stopper regions formed of a portion of said semiconductor substrate, comprising the steps of:
   (a) forming a polycrystalline silicon layer on the insulating layer formed on a major surface of said semiconductor substrate,
   (b) forming a first masking layer for selective diffusion of doping impurities and selective removing said polycrystalline silicon layer, said first masking layer covering portions of said polycrystalline silicon layer in a direction substantially transverse to said one direction of charge transfer, leaving uncovered portions of said polycrystalline silicon layer, said uncovered portion having a predetermined width in the direction of said charge transfer and being formed periodically,
   (c) forming a second masking layer for selective removing said polycrystalline silicon layer, said second masking layer partially overlying on said first masking layer and leaving openings on the portions of said polycrystalline silicon layer laying over portions of said transfer channel,
   (d) selectively diffusing a doping impurity into said polycrystalline silicon layer through said first masking layer,
   (e) selectively removing said polycrystalline silicon layer by using said first and second masking layers and forming openings in said polycrystalline silicon layer, and
   (f) selectively diffusing a doping impurity into said substrate through said openings.

2. A method according to claim 1 wherein said channel stopper regions are defined by highly doped portions adjacent to the major surface of said substrate to form borders on both sides of said transfer channel defined by the portion having impurity concentration less than the impurity concentration of said channel stopper regions.

3. The method of claim 1 wherein said insulating layer is silicon dioxide.

4. The method of claim 1 wherein said first masking layer is silicon dioxide.

5. The method of claim 1 wherein said first masking layer is formed of a composite layer of silicon dioxide, silicon nitride and silicon dioxide.

6. The method of claim 1 wherein said step (f) is carried out by ion implantation through said insulating layer.

7. The method of claim 1 wherein one edge of said opening is defined by an edge of said first masking layer.

8. A method of manufacturing a charge transfer device having a plurality of electrodes formed on an insulating layer formed on a major surface of a semiconductor substrate, and a transfer channel formed of a portion of said substrate bordered by channel stopper regions formed in a portion of said substrate, said transfer channel having narrowed portions bordened by said channel stopper regions to make an asymmetrical potential well in the direction of charge transfer comprising the steps of:
   (a) preparing a semiconductor substrate,
   (b) forming channel stopper regions, bordering both sides of said transfer channel in respect of the direction of charge transfer,
   (c) forming an insulating layer on the major surface of the substrate,
   (d) forming a polycrystalline silicon layer on said insulating layer,
   (e) forming a first masking layer on said polycrystalline silicon layer for selective diffusion of doping impurity and selective removing of said polycrystalline silicon layer said first masking layer covering portions of said polycrystalline silicon layer in a direction substantially transverse to said direction of charge transfer, leaving uncovered portions of said polycrystalline silicon layer, said uncovered portions having a predetermined width in the direction of said charge transfer and being formed periodically,
   (f) forming a second masking layer for selective removing of said polycrystalline silicon layer said second masking layer partially overlying on said first masking layer and leaving openings on the portions of said polycrystalline silicon layer lying over portions of said transfer channel,
   (g) selectively diffusing a doping impurity into said polycrystalline silicon layer through said first masking layer to form a plurality of electrodes,
   (h) selectively removing said polycrystalline silicon layer through said first and second masking layers to make openings in said polycrystalline silicon layer and said openings formed over a part of said first masking layer and a part if said transfer channel, and
   (i) selectively diffusing a doping impurity into said substrate through said openings to form said narrowed portions of said transfer channel.

9. A method of manufacturing a charge transfer device having a plurality of electrodes formed on an insulating layer formed on a major surface of a semiconductor substrate, and a transfer channel formed of a portion of said substrate bordened by channel stopper regions formed of portions of said substrate, said transfer channel having narrowed portions to make an asymmetrical potential well in a direction of charge transfer including the following steps in order,
   (a) preparing a semiconductor substrate, (b) forming channel stopper regions bordening both sides of said transfer channel in respect of the direction of charge transfer,
(c) forming an insulating layer on the major surface of said substrate,
(d) forming a polycrystalline silicon layer on said insulating layer,
(e) forming a first masking layer for selective diffusion of doping impurity into said polycrystalline silicon layer and selective removing of said polycrystalline silicon, said first masking layer covering portions of said polycrystalline silicon layer in a direction substantially transverse to said direction of charge transfer, leaving uncovered portions of said polycrystalline silicon layer, said uncovered portions having predetermined width in the direction of said charge transfer and being formed periodically,
(f) selectively diffusing a doping impurity into said polycrystalline silicon layer through said first masking layer to form a plurality of electrodes,
(g) forming a second masking layer for selective removing of said polycrystalline silicon layer, said second masking layer partially overlying on said first masking layer and leaving openings on the portions of said polycrystalline silicon layer lying over portions of said transfer channel,
(h) selectively removing portions of said polycrystalline silicon layer through said second masking layer in cooperation with said first masking layer to make openings in said polycrystalline silicon layer lying over said portions of said transfer channel, and
(i) selectively diffusing a doping impurity into said substrate through said openings formed in said polycrystalline silicon layer to form said narrowed portions of said transfer channel.

10. A method of manufacturing a charge transfer defice having a plurality of electrodes formed on an insulating layer formed on a major surface of a semiconductor substrate, and a transfer channel formed of a portion of said substrate bordened by channel stopper regions formed of portions of said substrate, said transfer channel having narrowed portions to make an asymmetrical potential well in a direction of charge transfer including the following steps in the order,
(a) preparing a semiconductor substrate,
(b) forming channel stopper regions bordening both sides of said transfer channel in respect of the direction of charge transfer,
(c) forming an insulating layer on the major surface of said substrate,
(d) forming a polycrystalline silicon layer on said insulating layer,
(e) forming a first masking layer for selective diffusion of doping impurity into said polycrystalline silicon layer and selective removing of said polycrystalline silicon, said first masking layer covering portions of said polycrystalline silicon layer in a direction substantially transverse to said direction of charge transfer, leaving uncovered portions of said polycrystalline silicon layer, said uncovered portions having predetermined width in the direction of said charge transfer and being formed periodically,
(f) forming a second masking layer for selective removing of said polycrystalline silicon layer, said second masking layer partially overlying on said first masking layer and leaving openings on the portions of said polycrystalline silicon layer lying over portions of said transfer channel,
(g) selectively removing portions of said polycrystalline silicon layer through said second masking layer in cooperation with said first masking layer to make openings in said polycrystalline silicon layer laying over said portions of said transfer channel,
(h) removing said second masking layer, and
(i) selectively diffusing a doping impurity into said polycrystalline silicon layer and said substrate simultaneously to form said plurality of electrodes and said narrowed portions of said channel stopper regions.

* * * * *